United States Patent
Shin et al.

(10) Patent No.: US 11,000,975 B2
(45) Date of Patent: May 11, 2021

(54) METHODS OF MAKING HYDROPHOBIC CONTOURED SURFACES AND HYDROPHOBIC CONTOURED SURFACES AND DEVICES MADE THEREFROM

(71) Applicant: Purdue Research Foundation, West Lafayette, IN (US)

(72) Inventors: Yung C Shin, West Lafayette, IN (US); Shashank Sarbada, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 15/730,902

(22) Filed: Oct. 12, 2017

(65) Prior Publication Data
US 2018/0117797 A1    May 3, 2018

Related U.S. Application Data

(60) Provisional application No. 62/407,857, filed on Oct. 13, 2016.

(51) Int. Cl.
| | |
|---|---|
| *B29C 59/00* | (2006.01) |
| *B29C 33/42* | (2006.01) |
| *B29C 33/38* | (2006.01) |
| *B29C 35/02* | (2006.01) |
| *B29C 41/42* | (2006.01) |
| *B81C 1/00* | (2006.01) |

(Continued)

(52) U.S. Cl.
CPC .......... *B29C 33/42* (2013.01); *B23K 26/0624* (2015.10); *B23K 26/355* (2018.08); *B29C 33/3857* (2013.01); *B29C 35/02* (2013.01); *B29C 41/42* (2013.01); *B81C 1/00031* (2013.01); *B81C 1/00055* (2013.01); *B81C 1/00119* (2013.01); *C08L 83/04* (2013.01); *C09D 183/04* (2013.01); *B23K 2103/04* (2018.08); *B23K 2103/10* (2018.08); *B23K 2103/12* (2018.08); *B29K 2083/00* (2013.01)

(58) Field of Classification Search
CPC ... B29C 64/00; B29C 43/02; B29C 33/56–62; B29C 33/68; B29C 43/08; B29C 59/00; B29C 59/02; B29C 59/007; B29C 59/023; B33Y 30/00; B33Y 99/00
See application file for complete search history.

(56) References Cited

U.S. PATENT DOCUMENTS

| | | | |
|---|---|---|---|
| 8,486,753 B2 * | 7/2013 | Park | H01L 33/42 438/104 |
| 2011/0011148 A1 * | 1/2011 | Chen | B44C 1/20 72/352 |
| 2011/0287203 A1 * | 11/2011 | Victor | B29C 43/021 264/293 |

* cited by examiner

*Primary Examiner* — Joseph S Del Sole
*Assistant Examiner* — Thu Khanh T Nguyen
(74) *Attorney, Agent, or Firm* — Purdue Research Foundation; D. H. R. Sarma

(57) ABSTRACT

A method of creating a polymer surface with surface structures is disclosed. The method includes creating a mold, forming a metal sheet into the molds, creating a surface structure on a surface of the metal sheet by exposing the surface to laser pulses, and bringing a curable polymer to be in contact with the surface of the metal sheet containing the surface structure, curing the curable polymer, and separating the cured polymer from the metal sheet, resulting in a polymer surface containing the surface structure. The polymer surfaces with the surface structures can be hydrophobic or superhydrophobic depending on the micro and nano features contained by the surface structures.

9 Claims, 12 Drawing Sheets

(51) Int. Cl.
_C08L 83/04_ (2006.01)
_B23K 26/352_ (2014.01)
_C09D 183/04_ (2006.01)
_B23K 26/0622_ (2014.01)
_B29K 83/00_ (2006.01)
_B23K 103/04_ (2006.01)
_B23K 103/10_ (2006.01)
_B23K 103/12_ (2006.01)

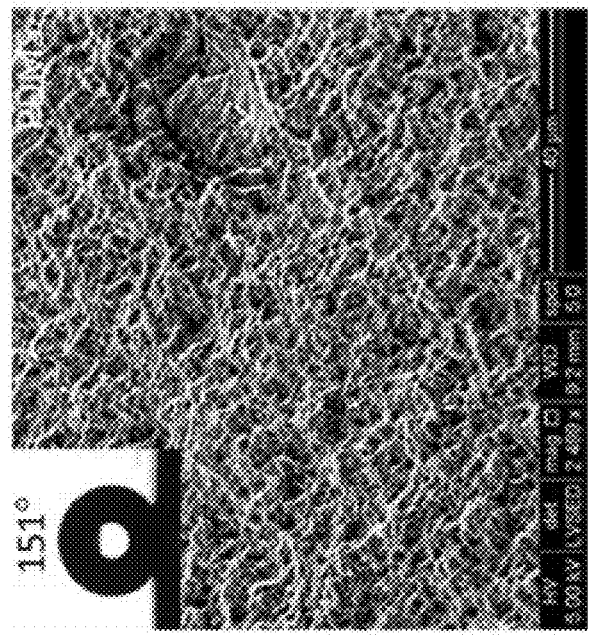
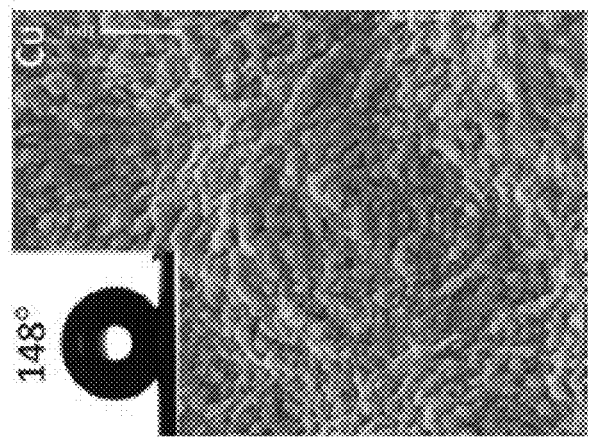
FIG. 4B
FIG. 4A

METHODS OF MAKING HYDROPHOBIC CONTOURED SURFACES AND HYDROPHOBIC CONTOURED SURFACES AND DEVICES MADE THEREFROM

CROSS-REFERENCE TO RELATED APPLICATIONS

The present U.S. patent application is related to and claims the priority benefit of U.S. Provisional Patent Application Ser. No. 62/407,857 filed Oct. 13, 2016, the contents of which are hereby incorporated by reference in their entirety into the present disclosure.

TECHNICAL FIELD

The present disclosure generally relates to methods and processes to create hydrophobic surfaces, on metal and polymer surfaces and structures produced by such methods.

BACKGROUND

This section introduces aspects that may help facilitate a better understanding of the disclosure. Accordingly, these statements are to be read in this light and are not to be understood as admissions about what is or is not prior art.

The wettability of solid surfaces has been a subject of interest for many years due to the wide ranging applications involving such interactions. Surface wettability is commonly measured in terms of contact angle. Surfaces exhibiting a water contact angle below 90° are termed as hydrophilic surfaces while those with a water contact angle greater than 90° are termed as hydrophobic surfaces. Superhydrophobic surfaces have contact angles with water that are above 150°. Surface energy and roughness are the major contributing factors that determine whether a surface is wetting or non-wetting. An important parameter used to characterize the wetting nature of surfaces is the contact angle hysteresis. This can be measured as the difference between the advancing and receding contact angles at the instant before a droplet rolls off the surface as it is tilted. This is often used to characterize whether the surface is sticky or slippery. A small contact angle hysteresis is desirable when slippery surfaces with low roll off angles are required.

Surface chemistry plays an important role in determining the wettability of a surface. The presence of high surface energy chemical groups such as —OH, —NH$_2$, —COOH, —OSO$_3$H, —NH$_3^+$, —COO$^-$, —OSO$_3^-$, promotes hydrophilicity, whereas materials such as hydrocarbon, fluorocarbon or silicone based polymers have low surface energy and exhibit hydrophobicity. The surface roughness or structure is another factor that determines the wettability of a surface. Many studies to understand the effects of surface structure on the wettability of materials reported the structural requirements such as aspect ratio and spacing between features to achieve the hydrophobicity. For instance, the Cassie-Baxter state promotes non-wetting by reducing the surface area of a material in contact with the liquid. The Cassie Baxter state also helps achieve lower contact angle hysteresis making the roll off angle smaller. Convex structures with rounded tops promote the Cassie Baxter state and help achieve hydrophobicity. Hierarchical or multi scale structures are also preferred as they allow the scale of roughness to be reduced. Materials that are inherently hydrophilic require a chemical coating or treatment to make them hydrophobic. These and other design considerations must be used when creating hydrophobic surfaces.

Several methods to create hydrophobic surface have been reported in literature. These methods include both chemical treatments to reduce surface energy and surface structuring to increase surface roughness. The methods to create hydrophobic structures include lithography, chemical vapor deposition, sol-gel process, plasma etching, laser texturing and several others. Laser texturing has been used as a one-step process to create surface structures on various materials to achieve varying degrees of hydrophobicity. However, these studies are limited to creating hydrophobic structures on flat surfaces and do not provide a method to provide textures complex contours and cavities to create hydrophobic surfaces in contoured surfaces.

There are several applications of hydrophobic and superhydrophobic surfaces in fields such as cell biological research, opto-fluidics, fuel cell research, drag reduction, printing, etc. The choice of materials, fabrication technique and degree of hydrophobicity required depends on the specific application. Microfluidics is one such a field where surface wettability plays an important role. The contact angle and roll off angle of a liquid flowing through a micro channel influence the flow characteristics. Microfluidics are used in many applications such as DNA analysis, enzymatic analysis, clinical pathology among others, some of which require the flow rate in micro channels to be controllable. External flow control devices such as pressure generators and pumps are often used to control the flow rate through these devices. However, in cases where individual channels in a device are to be controlled, internal flow controls are required. This is often achieved by varying the channel cross section or by using flow control valves. A more space efficient alternative to this is to alter the wettability of channel walls so as to vary the flow rate through the channel. Chemical treatment of the channel inner walls is often done to achieve the desired contact angle. This is done using methods such as modification with octadecyltrichlorosilane (OTS) self-assembled monolayers (SAMs), aerosol assisted chemical vapor deposition (AACVD), plasma deposition of octafluorocyclobutane (C$_4$F$_8$) and other methods]. There are, however, disadvantages of using chemical methods to achieve hydrophobic channel walls. The cost of procuring, handling, storing and disposing chemicals adds to the fabrication cost. The presence of certain chemicals can interfere with and prohibit the use of some fluids in these devices. In addition to this, chemicals coatings can get washed away or deteriorate with time. Also, since most of these studies were limited to creating flat superhydrophobic surfaces for fluid manipulation they did not involve texturing all the inner walls of the microfluidic device. There is currently the lack of quick and inexpensive technique to accurately control the feature size and contact angle of features inside microfluidic channels. There have been several studies on the drag reduction capabilities of superhydrophobic surfaces in microfluidic devices. Studies have shown that a significant reduction in flow resistance of over 95% is achievable in textured channels as compared to flat channels of the same material. A 40% reduction in pressure drop has been reported due to drag reduction in microfluidic channels by using hydrophobic surface microstructures. Plasma treatments have been used to fabricate microfluidic channels with superhydrophobic inner channel walls. A 27% reduction in pressure drop in Teflon microfluidic devices has been reported by using sandpaper of different grit sizes to enhance surface roughness and promote superhydrophobicity.

Thus there exists an unmet need for a quick and inexpensive fabrication technique to hydrophobic structures on contoured surfaces for use in many applications including and not limited to microfluidic devices having channels with controllable flow rate without the use of chemical treatment or complex flow control devices.

SUMMARY

A method of creating a polymer surface with surface structures is disclosed. The method includes creating a mold, forming a metal sheet into the molds, creating a surface structure on a surface of the metal sheet by exposing the surface to laser pulses, and bringing a curable polymer to be in contact with the surface of the metal sheet containing the surface structure, curing the curable polymer, and separating the cured polymer from the metal sheet, resulting in a polymer surface containing the surface structure.

A technical effect of the invention is the creation of hydrophobic and superhydrophobic surfaces by tailoring these surface structures in terms of their micro and nano features.

BRIEF DESCRIPTION OF DRAWINGS

While some of the figures shown herein may have been generated from scaled drawings or from photographs that are scalable, it is understood that such relative scaling within a figure are by way of example, and are not to be construed as limiting.

FIGS. 4A and 4B show nano roughness created on copper showing a water contact angle of 148° and on PDMS showing a contact angle of 151° respectively.

DETAILED DESCRIPTION

Figure 1:
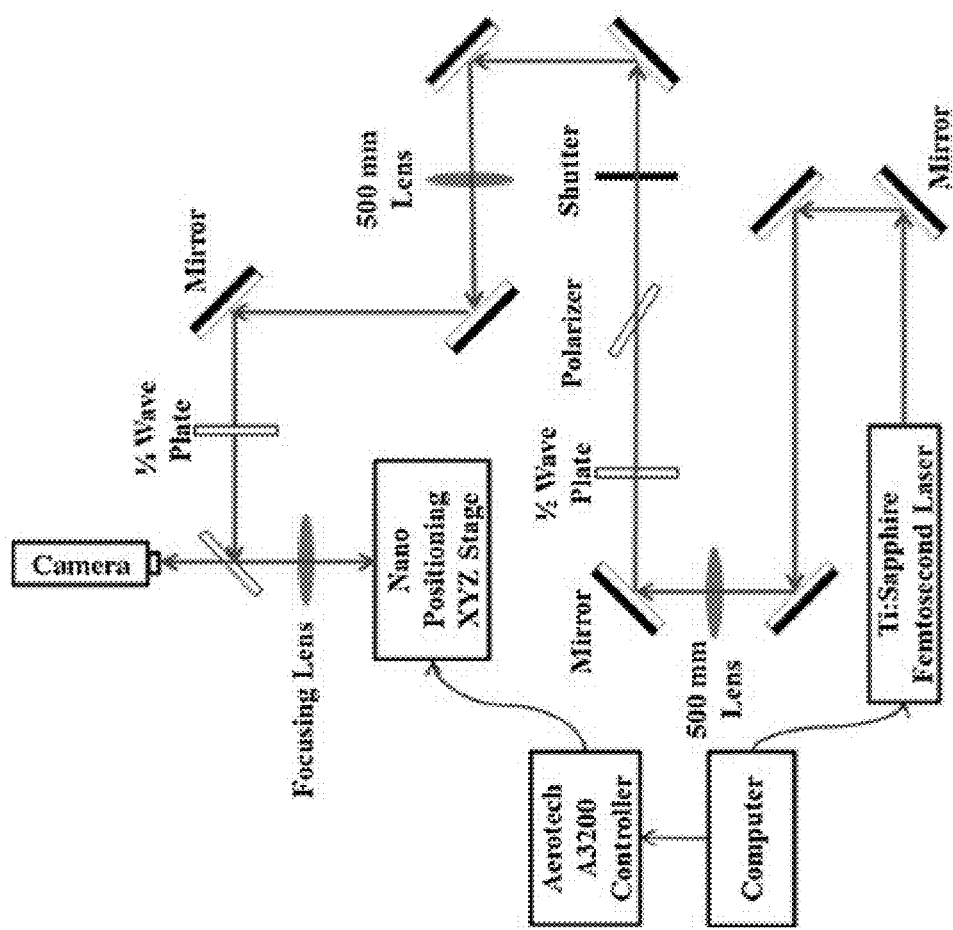
FIG. 1 is a schematic representation of Femtosecond laser setup used to create hydrophobic surface structures.

For the purposes of promoting an understanding of the principles of the disclosure, reference will now be made to the embodiments illustrated in the drawings and specific language will be used to describe the same. It will nevertheless be understood that no limitation of the scope of the disclosure is thereby intended.

In the present disclosure, a method to process to fabricate superhydrophobic surfaces on metals and polymers is presented. Using high speed femtosecond laser pulses, surface structures have been created on metal surfaces and transferred onto Polydimethylsiloxane (PDMS) to achieve superhydrophobic surfaces. Various surface micro and nano structures are presented and their wetting properties are discussed. Water contact angles of over 150° and a roll off angle of less than 5° were achieved on the textured copper and PDMS surfaces. A fast and inexpensive method to create microfluidic devices with textured superhydrophobic inner channel walls is described. These channels allow a controllable fluid flow rate through microfluidic devices. A 186% increase in fluid flow rate though PDMS microchannels was achieved through the fabrication of hydrophobic structures on the inner channel walls.

FIG. 1 shows a Ti-Sapphire femtosecond laser (Spectra Physics—Spitfire Pro) used to create superhydrophobic surface structures on metal surfaces. The laser generates a linearly polarized Gaussian beam with a wavelength of 800 nm. The pulse width is 100 fs with a pulse repetition rate of 1 kHz. The set up consisted of a half wave plate and a thin film polarizer to control the power output. A high speed shutter was used to control the laser beam for marking. This was followed by a quarter wave plate to achieve circular polarization. The beam was focused using a 45 mm focal length objective lens. A high precision nano positioning 3 axis computer controlled stage (Aerotech ANT130-XY and ANT130-5-V) was used to mount and position the target sample in the laser beam focal plane.

In experiments leading to this disclosure, Copper foils were used as target metallic samples in the experiments. The polymer used in the study was Sylgard 184 PDMS silicone elastomer. The structures formed on metallic surfaces were transferred onto PDMS by transfer molding. The polymer base and curing agent were mixed in a 10:1 ratio, poured over the textured metallic surfaces and allowed to cure for 48 hours in a petri dish. The cured PDMS was peeled off the metallic surface to reveal the textured PDMS surface.

In order to create micro channels, aluminum blocks were used as molds. The blocks were polished and machined in a micro-milling machine. A ball nose end mill with a nose diameter of 300 μm was used to make semicircular channels in the molds. A larger ball nose end mill with a nose diameter of 900 μm was used to machine inlets and outlets to connect tubing. The mold was used to mechanically form thin metallic foils into the desired channel shape. These formed foils were then textured using the laser to create superhydrophobic structures. The formed and textured metal foils were used as molds for PDMS to create polymer micro channels with textured superhydrophobic inner walls.

In order to study the surface structures created on metallic surfaces, an optical microscope, an optical profiler and a scanning electron microscope (SEM) were used. The metallic surfaces were cleaned using acetone followed by methanol in an ultrasonic cleaner. In the case of PDMS, since the samples were nonconductive, an environmental SEM (ESEM) was used in low vacuum mode to prevent charging. Micro channels created in metals and polymers were imaged and measured using a 3D optical profiler. The contact angle measurements of the textured surfaces were done using an automated contact angle goniometer. A 5 μl ultra-pure water droplet was placed on the surface and imaged to measure to the contact angle. The goniometer sample stage was tilted in 1° steps to measure the droplet roll off angle.

The channels made suitable for microfluidic devices and applciations were tested to study the effect of the superhydrophobic channel walls on the flow rate through the channels. This was compared with the flow through un-textured channels. Water was supplied to the inlet of the microchannels at a constant flow rate. The inlet flow rate was maintained constant and the same supply was branched into two and supplied to the textured and un-textured microchannels. The rate of flow through the channels was measured by collecting water at the channel outlets for a fixed time period of time and weighing the collected water using a high precision weighing scale.

Figures 2A, 2B:
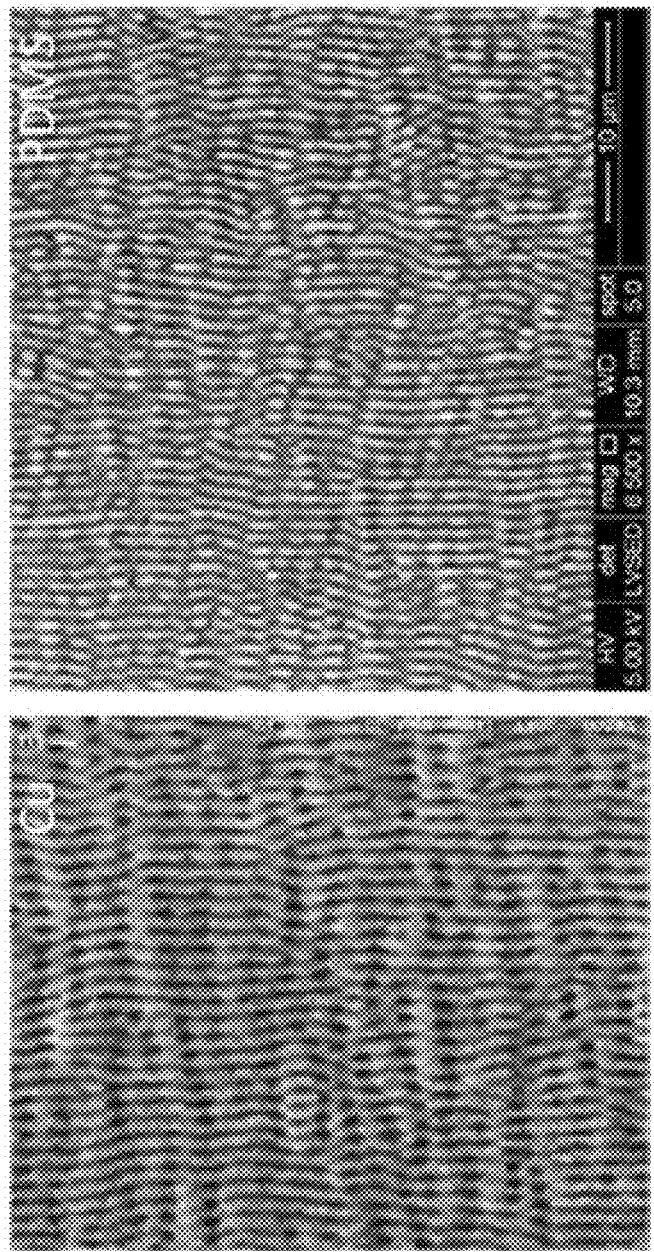
FIGS. 2A and 2B show SEM images of laser induced periodic surface structures (LIPSS) created on the surface of copper, and transferred onto PDMS using transfer molding respectively.

Copper was used as the metallic sample in the study due to its excellent formability. The sample thickness was chosen to be 50 μm for its ease of handling and forming. Initial experiments were conducted to determine if nanostructures would successfully transfer from the metal surface onto PDMS. To evaluate the possibility of transferring the nanostructures from a metallic surface to PDMS, the copper surface was textured with laser induced periodic surface structures (LIPSS) using femtosecond laser pulses. The formation of LIPSS has been widely reported and studied in literature. It is attributed to the spatial periodic energy distribution at the irradiation surface due to interference between the incident laser beam and the surface plasmon polaritons. The laser fluence was varied in the range of 4 $J/cm^2$ and 12 $J/cm^2$ while maintaining a 90% overlapping ratio in the scan direction, to create LIPSS of varying depths. The textured surface was imaged under the SEM. The LIPSS period was measured to be between 670 nm and 700 nm while the depth varied between 300 nm and 500 nm. PDMS base, mixed with the curing agent was poured onto the textured surfaces and allowed to cure, following which, the PDMS was peeled off the surfaces of the metals. Since PDMS is non-conductive, the surface was sputter coated with platinum before SEM imaging to create a conductive top layer to prevent sample charging. However, it was found that due to the flexibility of PDMS, the sputter coated platinum layer was broken and cracked easily, making SEM imaging difficult. In order to study the surface of PDMS, an environmental SEM was used at low vacuum. This allowed imaging of the non-conductive PDMS without a conductive coating. FIG. 2 shows SEM images of laser induced periodic surface structures (LIPSS) created on the surface of copper (left) and transferred onto PDMS (right) using transfer molding. Referring to FIG. 2, it can be seen that the surface nano structures were successfully transferred onto PDMS with no damage to the surface features. The details of the surface were maintained and the PDMS surface was found to replicate the copper surface.

Figure 3B:
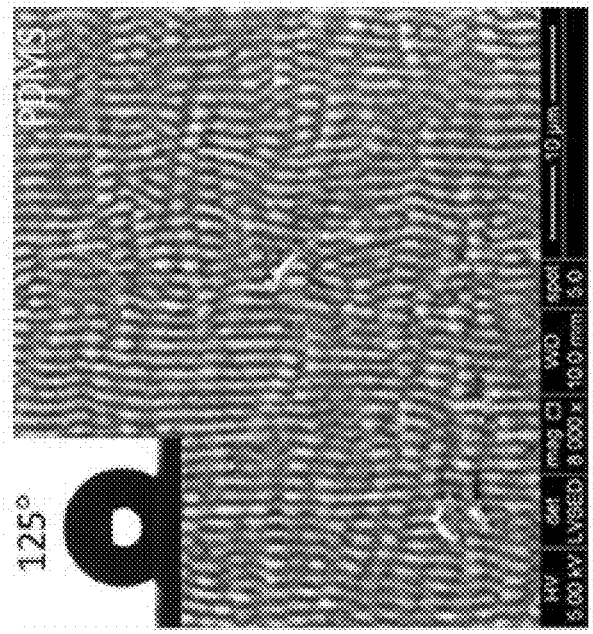
FIGS. 3A and 3B show LIPSS created on copper showing a water contact angle of 147° and on PDMS showing a contact angle of 125° respectively.
Figure 3A:
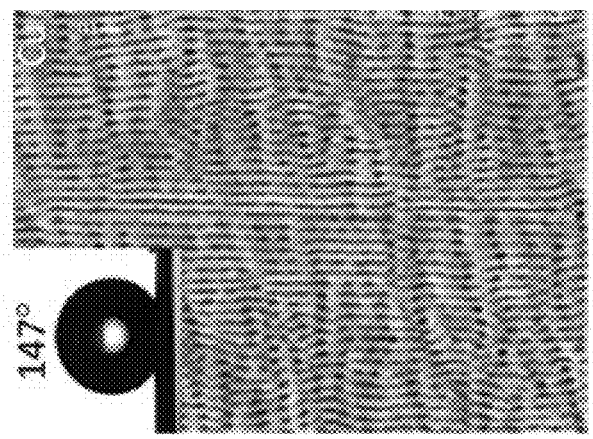

Utilizing the above method, Nano surface structures were created on copper and transferred to PDMS to increase the water contact angle and reduce the roll off angle. Initial experiments were conducted to study the effects of LIPSS and random nano roughness on the surface wettability of copper and PDMS. The textured copper and PDMS surfaces were tested for water contact angle using an automated goniometer. FIG. 3 shows LIPSS created on copper showing a water contact angle of 147° as in inset (left part of FIG. 3)) and on PDMS showing a contact angle of 125° as in inset (right part of FIG. 3. FIG. 4 shows nano roughness created on copper showing a water contact angle of 148° as an inset (left part of FIG. 4) and on PDMS showing a contact angle of 151° as an inset (right part of FIG. 4). The parameters used to create each surface structure and the corresponding contact angle values achieved on copper and PDMS are discussed below.

In order to study the effect of periodic nano structures, LIPSS were created on the surface of copper by varying the femtosecond laser fluence between 4 $J/cm^2$ and 20 $J/cm^2$. A 50 μm spot size was used and parallel scans were made 40 μm apart. A scan speed of 15 mm/s was used resulting in a pulse-overlapping ratio of 70% in the scan direction. The resultant LIPSS had a period of 700 nm and a depth between 300 nm and 500 nm. These structures were completely transferred onto PDMS. For fluence values lower than 10 $J/cm^2$, the surface of the textured copper appeared iridescent due to the grating effect of shallow LIPSS. As the fluence was increased beyond this value the appearance became dull and eventually darker. This is attributed to the light trapping nature of LIPSS which is amplified as the depth of features increases. The SEM and ESEM images of the copper and PDMS surfaces respectively are shown in FIG. 3. The highest water contact angle of 147° was measured on the surface of copper textured with LIPSS using a fluence value of 14 $J/cm^2$. The roll off angle in this case was found to be 48°. The corresponding PDMS surface resulted in a contact angle of 125°. The water droplet strongly adhered to the PDMS surface and did not roll off even at 90° angle. The goniometer images of water droplets on the surfaces of copper and PDMS are also shown in FIG. 3.

It was observed that the contact angle of copper was reduced, immediately after laser texturing and ultrasonic cleaning. This is attributed to the fact that copper is inherently hydrophilic and the surface roughness leads to an increase in this hydrophilicity. However, after PDMS is cured on the surface for the texture transfer, the copper behaves hydrophobic possibly due to silanization of the textured surface. Since the textured surface contains a thin oxide layer, the hydroxyl groups present on the surface may displace the alkoxy groups forming a Si—O—Si bond on the surface accounting for the decrease in surface energy and increase in contact angle. It was also observed that the samples which were not treated with PDMS, when exposed to the ambient atmosphere for 10 to 15 days, eventually exhibited hydrophobicity. Such a transition from hydrophilicity to superhydrophobicity has been reported in earlier studies and is attributed to the addition of low surface energy carbon groups to the textured surface due to the decomposition of atmospheric $CO_2$. The contact angle measured on copper samples exposed to the atmosphere for 15 days, were found to be similar to the contact angles achieved on copper immediately after the PDMS transfer.

The LIPSS textured surface was compared with a surface covered in random nano bumps. In order to create a surface covered with nano scale roughness, the fluence used was in the range of 60 $J/cm^2$ and 100 $J/cm^2$. The surface was scanned in a grid pattern at a scan speed between 1 mm/s and 2 mm/s with a 10 μm spacing between adjacent passes. These structures were transferred onto PDMS as can be seen in FIG. 4. The highest contact angle achieved in the case of copper was 148° while PDMS showed superhydrophobicity with a contact angle of 151°. The roll off angle for this surface, was nearly 40° making it unsuitable for drag reduction applications. From these results it was observed that nano bumps were more effective in increasing the contact angle as compared to periodic ripples. This is attributed to the fact that the surface area in contact with the liquid is minimized in the case of random nano roughness leading to reduced forces of adhesion at the interface.

Nano structured surfaces were found to increase the contact angle but due to the high contact angle hysteresis on these surfaces, the roll off angles were high. This is undesirable for surface drag reduction applications. In order to reduce the hysteresis, dual scale features, namely, "dual scale micro/nano features" were created to promote the Cassie Baxter state of wetting. For purposes of this disclosure, the phrase or term "dual scale micro/nano features" is intended to mean features that comprise both nano-scale and micro-scale features. Based on design criterion identified] to create hydrophobic surface structures, it was decided to create convex microstructures covered with smaller nano scale features. Multi scale features were used to reduce the size of features required to achieve superhydrophobicity. The largest feature height was limited to 15 µm above the surface. The aspect ratio and spacing between features were varied to optimize the water contact angle. Various surface structures were created on the copper surfaces using femtosecond laser pulses as will be described below. These structures were transferred onto PDMS and the water contact angles were measured using the goniometer.

Figures 5A, 5B:
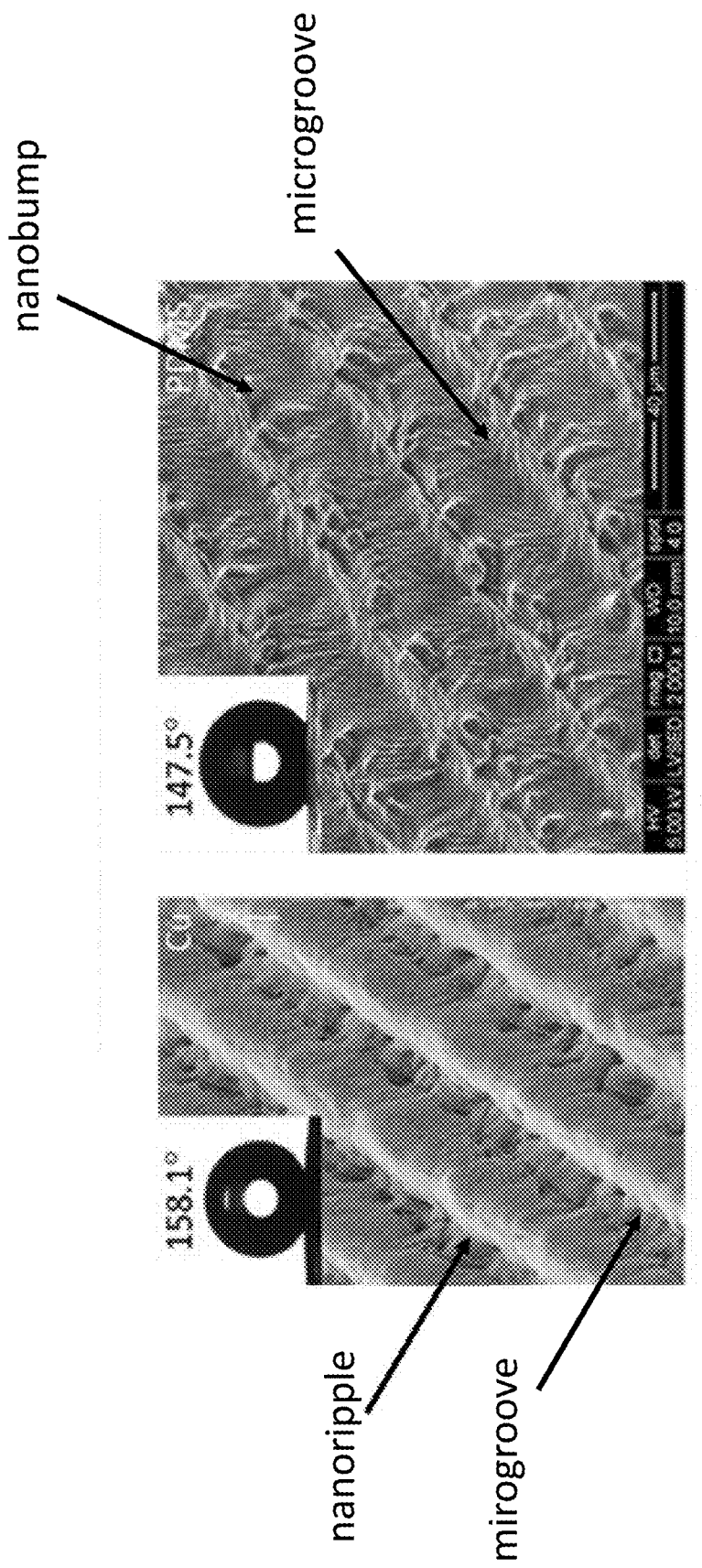
FIGS. 5A and 5B show micro-grooves with nano-ripples created on copper showing a water contact angle of 158.1° and on PDMS showing a contact angle of 147° respectively.
Figure 5D:
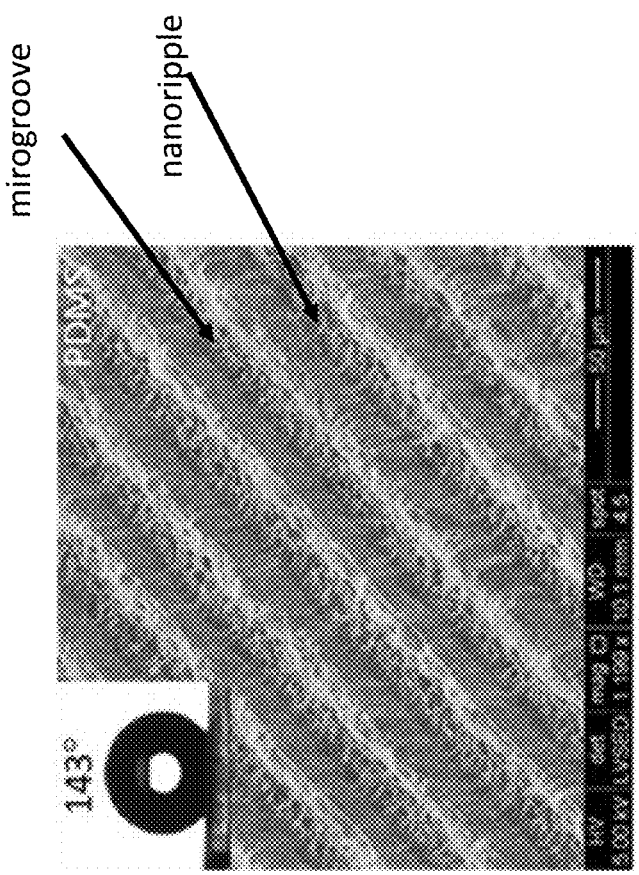
FIGS. 5C and 5D show micro-grooves with nano-ripples created on copper showing a water contact angle of 162° and on PDMS showing a contact angle of 143° respectively.
Figure 5C:
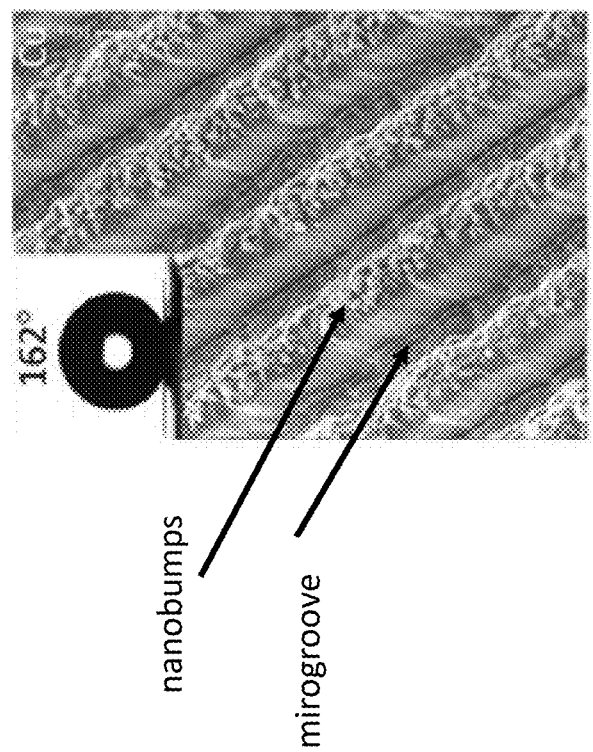

By using the techniques described above, parallel micro grooves with nano LIPSS were created. FIG. 5A shows micro-grooves, which are parallel deep grooves with the spacing of a few tens of microns (10-50 microns), with nano-ripples, which are surface undulations of less than 1 micron, created on copper showing a water contact angle of 158.1° (left) and on PDMS showing a contact angle of 147° (right). (Note: Nanoripples in copper are transferred to PDMS to become nanobumps as they are negative patterns of each other.). Parallel scans were made on the surface of copper and the fluence was varied between 80 J/cm$^2$ and 120 J/cm$^2$ to ablate the copper surface and inscribe the desired microstructure. The spacing between channels was varied between 10 µm and 50 µm and the overlapping ratio between 75% and 90% in the scanning direction. The highest contact angles were achieved for a spacing of 25 µm and a fluence value of 95.5 J/cm$^2$. The features were measured to be 8 µm in height. In the case of copper this resulted in a contact angle of 158.1° and a roll off angle of 7°. The PDMS replica showed some nano bumps with less than 1 microns in size, which are transferred negative patterns of nanoripples on copper, on top of the micro grooves due to the valley texture of the copper grooves. This resulted in a 147.5° contact angle with a low roll of angle under 8° in the case of PDMS.

By increasing the fluence and varying the overlapping ratio between 90% and 95%, microchannels with nano bumps were created on copper, as seen in FIG. 5B. The highest contact angles were achieved for a groove spacing of 25 µm and a feature height of 10 µm. The copper surface was found to be highly hydrophobic and exhibited a contact angle of over 160° and a low roll off angle of less than 5°. The small spacing between the grooves allow for higher pressures to be handled by the surface before a transition from Cassie Baxter to Wenzel state takes place. This allows the surface to remain superhydrophobic under higher fluid pressures. The PDMS replica showed slightly different top surface nano structures due to a difference in the valley texture in the copper grooves. This resulted in a lower contact angle of 143° in the case of PDMS. The roll off angle on PDMS was slightly higher but was found to be under 10°. In both the cases of micro grooves, it was observed that nano bumps are more effective in increasing the contact angle and reducing the roll off angle as compared to nano ripples.

Figures 6A, 6B:
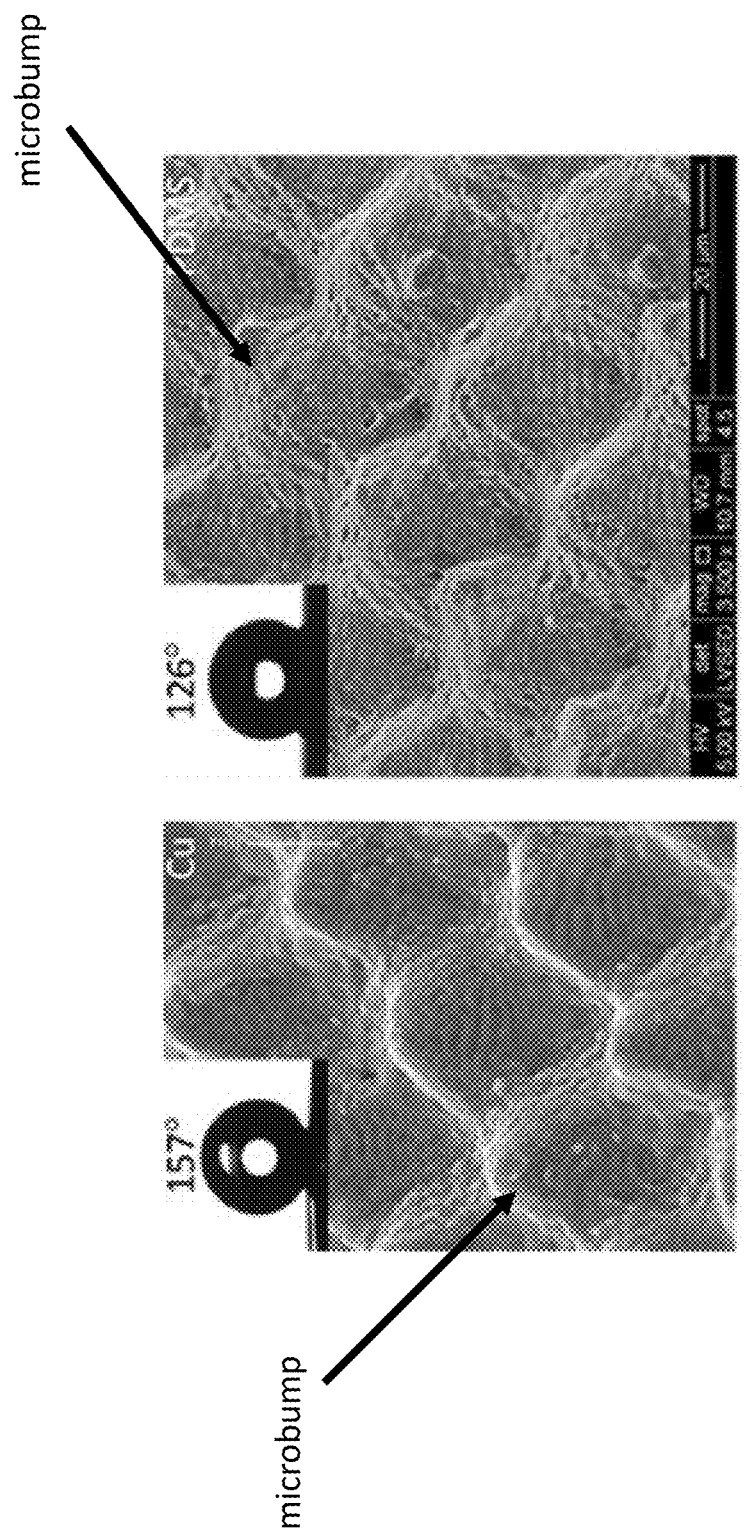
FIGS. 6A and 6B show micro-bumps with nano-ripples created on copper showing a water contact angle of 157° and on PDMS showing a contact angle of 126° respectively.
Figure 6C:
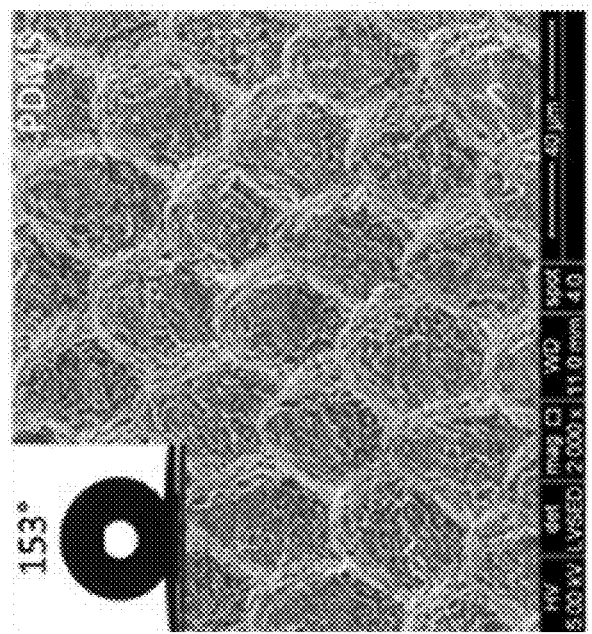
FIGS. 6C and 6D show micro-bumps with nano-ripples created on copper showing a water contact angle of 165° and on PDMS showing a contact angle of 153° respectively.
Figure 6D:
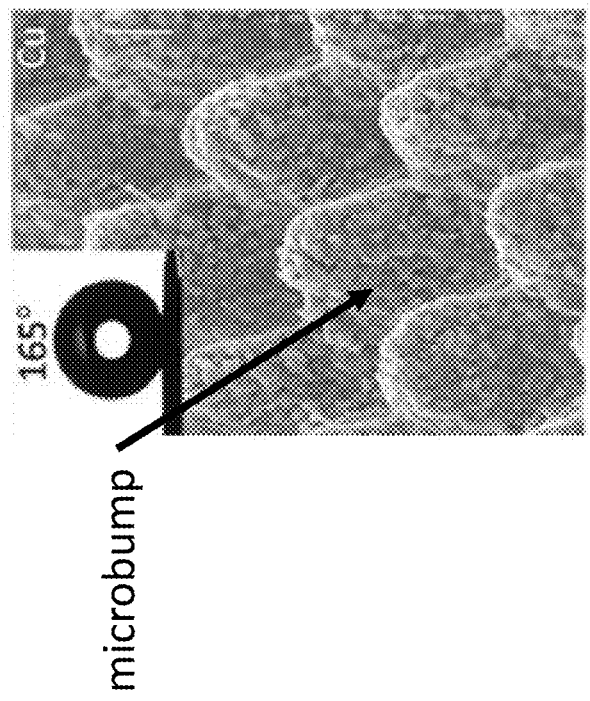

In order to further reduce the contact area of water on the surface and enhance the Cassie Baxter state of wetting, micro bump features were created on the surface of copper. Micro bumps covered with nano scale LIPSS were created by scanning the surface in the shape of a grid with lines normal to each other. A spot size of 20 µm was used and the spacing between scan lines was varied between 10 µm and 50 µm to achieve different micro bump profiles. The surface features were varied by changing the fluence between 15 J/cm$^2$ and 40 J/cm$^2$. High overlapping ratios of 90% to 95% were used. These structures were completely transferred onto PDMS as seen in FIG. 6A The highest contact angles achieved were 157° on copper and 126° on PDMS and corresponded to a spacing of 30 µm and a fluence of 32 J/cm$^2$. The microbumps on PDMS in FIG. 6A were measured to be 8 µm in height. The LIPSS on the surface had a period of 700 nm and a height of nearly 400 nm.

As in previous cases, varying the nano scale features on the surface was expected to change the wettability of the surface. Instead of nano ripples, nano bumps were created on the surface of micro features by varying the fluence between 80 J/cm$^2$ to 200 J/cm$^2$ and the overlapping ratios between 75% and 90%. These structures were transferred onto PDMS as seen FIG. 6B. The nanobumps are on the surface of the microbumps. Both the copper and PDMS surfaces were found to behave superhydrophobic. The highest contact angles achieved were 165° on copper and 153° on PDMS and corresponded to a spacing of 25 µm and a fluence of 95.5 J/cm$^2$. The features were measured to be 12 µm in height while the nano bumps were found to range from 100 nm to 1 µm. The contact angle hysteresis was found to be very low for this structure leading to low roll off angles of less than 5° on both copper and PDMS. Once again, it was observed that nano bumps were more effective in increasing the contact angle and reducing the roll off angle.

The water contact angles of the textured surfaces are summarized in Table 1 below.

TABLE 1

Summary of contact angle (CA) and roll off angle values for different surface structures

| Surface structure | Copper CA (°) | Copper Roll off angle (°) | PDMS CA (°) | PDMS Roll off angle (°) |
|---|---|---|---|---|
| LIPSS | 147 | 48 | 125 | — |
| Nano roughness | 148 | 26 | 151 | 40 |
| Micro grooves with nano ripples | 158 | 7 | 147.5 | 10 |
| Micro grooves with nana bumps | 162 | 4 | 143 | 8 |
| Micro bumps with nano ripples | 157 | 6 | 126 | 9 |
| Micro bumps with nano bumps | 165 | 2 | 153 | 3 |

Referring to Table 1, the water contact angles of the textured surfaces are summarized in Table 1. The highest contact angles of 165° for copper and 153° for PDMS were achieved in the cases of microbumps with a spacing between 25 µm and 30 µm created at a fluence of 95 J/cm$^2$. A high contact angle was also achieved on surfaces textured with micro grooves with nano ripples having a spacing of 25 µm created at a fluence of 95 J/cm$^2$. Based on these results it can be concluded that nano scale features play an important role in determining the wettability of a surface. In all cases, nano bumps were found to be more effective than nano ripples in enhancing the surface wettability. It can also be concluded that various contact angles can be achieved on both metals and polymers by varying the surface geometry. This can be used in several applications including controlling fluid flow in microfluidics as will be discussed in subsequent sections.

One of the many potential applications of superhydrophobic polymer surfaces is in microfluidics. The flow rate of fluids through micro-channels is an important parameter in the design of microfluidic devices. Chemical treatment is commonly used to change the wettability of microfluidic channel inner walls to vary the flow rate. As discussed earlier, there are limitations to using chemical treatments to vary the wettability of micro fluidic channel walls. The process discussed below allows the fabrication of textured hydrophobic microfluidic inner channel walls. This reduces the fluid drag at the microchannel walls and therefore allows control over the flow rate through the channel.

Figure 7A:
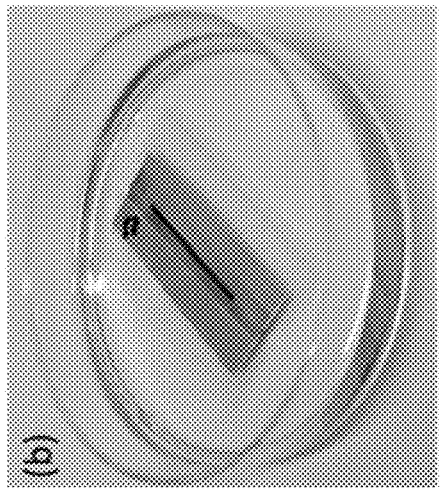
FIG. 7A shows micro machined aluminum microchannel mold.
Figure 7B:
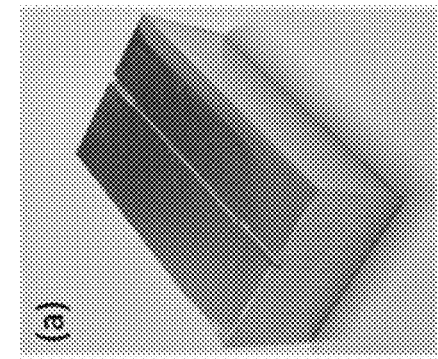
FIG. 7B shows formed and textured copper foil immersed in PDMS.
Figure 7C:
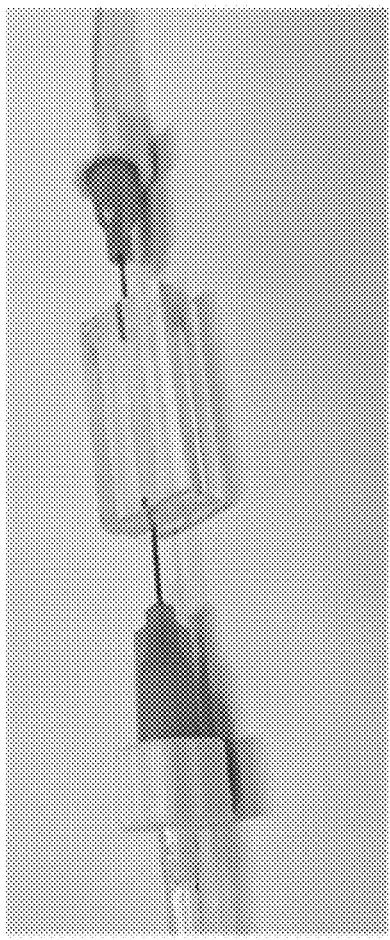
FIG. 7C shows PDMS microfluidic device with fluid inlet and outlet connections.
Figures 8A, 8B:
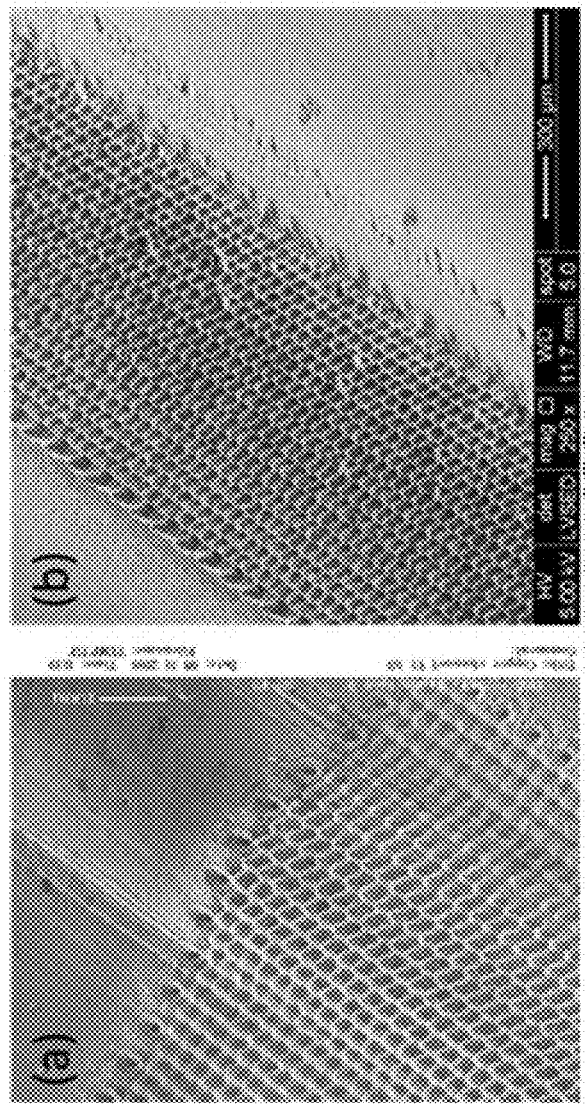
FIG. 8A shows SEM image of formed and textured copper microchannel.
FIG. 8B shows ESEM image of transferred PDMS microchannel.
Figure 8C:
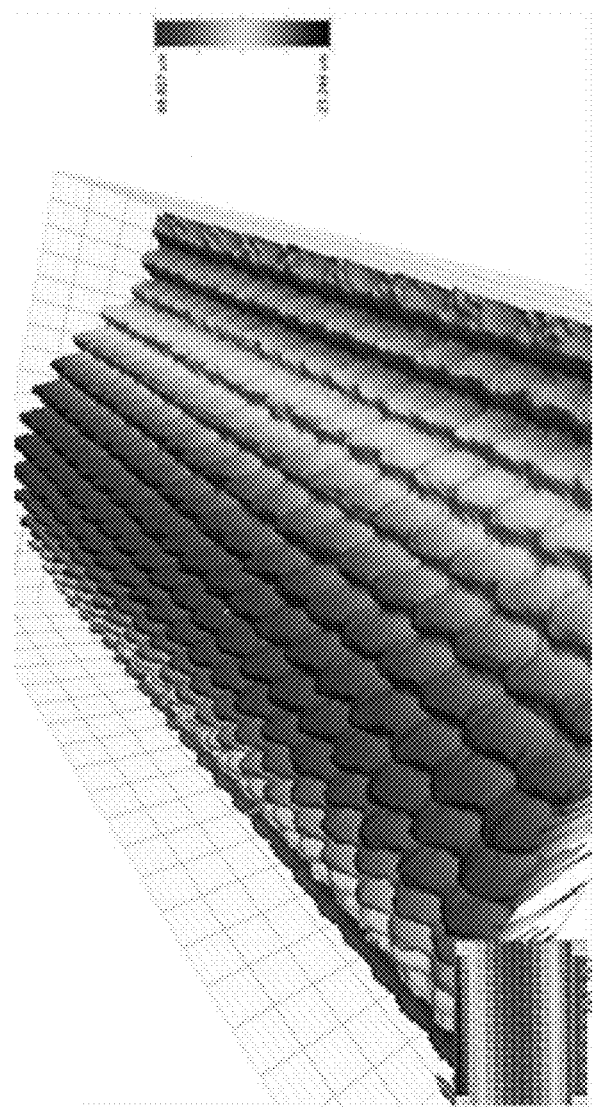
FIG. 8C shows 3D optical profiler image of a textured copper microchannel.

In order to create superhydrophobic inner walls in PDMS microfluidic channels, metallic molds were created using aluminum blocks as seen in FIG. 7A. The final microfluidic channel diameter was chosen to be 300 µm. Therefore, the aluminum mold channel was made using a 300 µm diameter micro ball end mill. The molds were designed to accommodate for the inlet and outlet ports of the microfluidic device. Different micro end mills were used to create the channel and the outlets. The molds were used to mechanically form 50 µm thin copper foil into the desired channel shape. The formed copper foils were textured using the femtosecond laser and placed in a petri-dish as seen in FIG. 7B. Micro bumps with nano bumps were chosen as the surface structure to achieve superhydrophobicity in the channels due to the high contact angles and low roll off angles achieved with these structures. These structures were selected to reduce the drag produced due to adhesive forces on water flowing inside the channel. The parameters used to create these surfaces were similar to the parameters discussed in creating microbumps and nanobumps. The textured channels were used as molds and PDMS was poured onto the textured foil. The cured PDMS was peeled off to reveal micro channels in the surface with textured inner walls. This formed one half of the micro fluidic device while and a second half was fabricated by the same process. The two PDMS halves were bonded together to form a completed microfluidic device as seen in FIG. 7C. A small amount of PDMS curing agent was used between the two halves which were aligned together and allowed to form a strong bond. Samples were prepared having both textured and un-textured channels but the channel length and diameter were kept contact in both cases. Needles with tubing were used to supply water to the devices to measure fluid flow. The textured copper and PDMS channels were imaged using an SEM and ESEM as seen in FIGS. 8A and 8B respectively. A 3D optical profiler was used to measure the dimensions of the copper channel as seen in FIG. 8C. Similarly, the diameter of the PDMS channel was also measured and found to be 300 µm from the base of the grooves, since the grooves were made at the surface of the copper sheet. The micro bumps were measured to be between 8 µm and 10 µm and therefore the overall dimensions of the PDMS channel was not affected much by this decrease in diameter.

Figure 9:
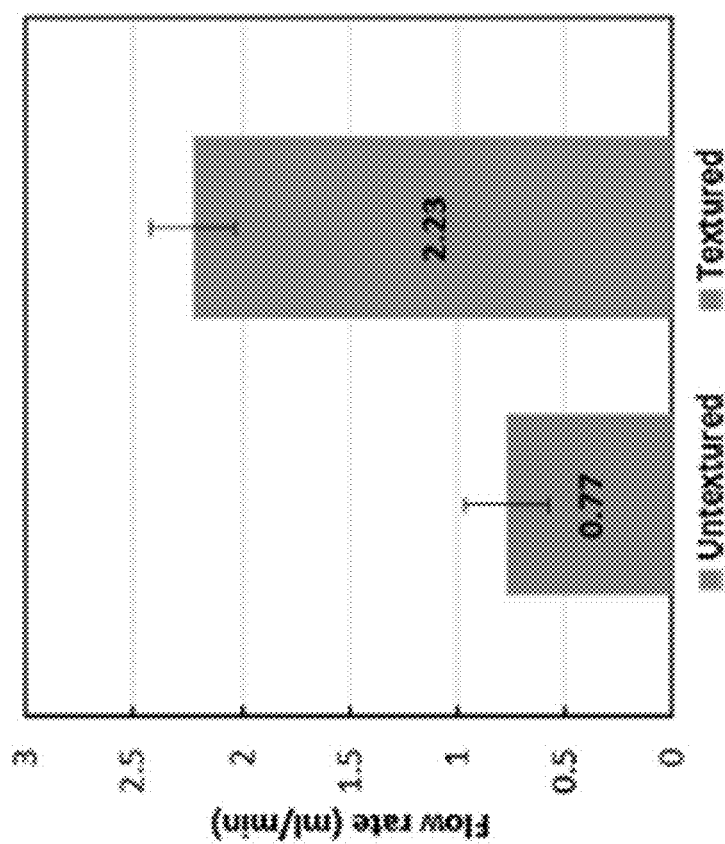
FIG. 9 shows flow rate measurements through textured and un-textured microfluidic channels

In order to compare the flow rate through the textured and un-textured devices, water was supplied through both devices at a constant pressure. A common source was used and a bifurcation in flow was created to supply fluid at an equal pressure to both devices. The flow rate through the device was calculated by collecting fluid at the outlets of the two devices for a fixed period of time and weighing the fluid collected at each outlet using a high precision weighing scale. A color dye was supplied through the channels to identify leaks in the devices. Several trials were run and it was found that in the case of the un-textured device, an average flow rate of 0.773 ml/min was achieved. For the same constant input flow rate, the average flow rate though the textured sample was found to be 2.227 ml/min as seen in FIG. 9. Therefore, a 186% increase in flow rate was achieved by texturing the inner walls of the microfluidic channel. The higher flow rate through the textured sample is attributed to the reduction in drag due to the superhydrophobic inner walls. By varying the hydrophobicity of the inner channel walls using different surface structures, the drag can be controlled accurately to achieve the desired flow rate through channels. As reported in an earlier study, at higher input pressures it is expected that a transition from Cassie Baxter to Wenzel state will occur leading to an increase in drag. However, at the low pressures used in most microfluidic applications this transition is not likely to occur.

The above described process can be used in applications where the resistance to flow though micro channels is to be reduced or controlled. Some examples of such applications are in fluid supply tubing, controlled mixing of fluids, syringes etc. Surface structures which help achieve high contact angles but also high contact angle hysteresis as seen in section 3.1 can be used to restrict flow through channels. This can be used to create flow control valves in microfluidic devices. A byproduct of this process is superhydrophobic copper. Although the copper surfaces turn superhydrophobic by exposure to ambient atmosphere, the PDMS treatment makes this process faster. The superhydrophobic copper surfaces can be used in applications such as MEMS, compact heat exchangers to increase thermal efficiency, water resistant electronics, drag reduction etc.

Thus in this disclosure, Various surface structures were designed and created on the surface of copper using femtosecond laser pulses with the objective of increasing the water contact angle and decreasing the roll off angle. Surface nano structures were found to have a strong impact on the contact angle of microstructured surfaces. Nano bumps were found to be more effective in increasing the contact angle as compared to periodic nano ripples for the same surface micro structure. Surfaces textured with micro bumps covered with smaller nano bumps were found to be the most effective in increasing water contact angle and achieving superhydrophobicity. These surface textures resulted in water contact angles over 165° and roll off angles of less than 5° in the case of copper. The structures were transferred onto PDMS through transfer molding to achieve superhydrophobic PDMS surfaces with a water contact angle of over 153°. The metal and polymer replica showed similar trends in wettability with changing surface structures.

Also, in this disclosure, a process to create microfluidic channels with superhydrophobic inner channel walls was described in detail. Formed and laser textured copper foils were used as microchannel molds and transferred to PDMS via transfer molding. The hydrophobicity of the inner wall surfaces is controllable through surface structure and can be used to reduce drag and vary the flow rate through microfluidic devices. By creating dual scale superhydrophobic surface structures on inner channel walls, the fluid flow rate through PDMS microfluidic devices as was increased by 186% compared to un-textured devices.

Based on the above description, it is an objective of this disclosure to describe a method method for creating a polymer surface with surface structures. The method includes creating a mold, forming a metal sheet into the mold, creating a surface structure on a surface of the metal sheet by exposing the surface to laser pulses, bringing a curable polymer to be in contact with the surface of the metal sheet containing the surface structure, curing the curable polymer, and separating the cured polymer from the metal sheet, resulting in a polymer surface containing the surface structure. In one embodiment of the method, the metal surface and the polymer surface are contoured surfaces. From the forgoing description, it should be noted that the method described in this disclosure is especially suited to create surface structures in contoured surfaces. Non-limiting examples of a metal that can be used in these methods include copper and aluminum. It should be noted that instead of a metal, an alloy, such as but not limited to alloys of copper or alloys of aluminum or steel, can be used. A non-limiting example of a polymer that can be used in the method of this disclosure is polydimethylsiloxane (PDMS).

In some embodiments of the method, the surface structure can be contained in a microchannel. As has been described in this disclosure, in some embodiments of the method, the surface structures formed on the polymer surface are superhydrophobic. It can be readily seen from the descriptions in this disclosure that in some embodiments the surface structure is contained in the microchannel is superhydrophobic.

It is also an objective of this disclosure to describe a polymer surface containing surface structures made by the above method and such surfaces can be superhydrophobic.

It is also an objective of this disclosure to describe a microfluidic device containing polymer surfaces that contain microchannel that are superhydrophobic it should be recognized that such microfluidic device can be part of a fluid supply or an apparatus for controlled mixing of fluids or a system employed for reduction of fluid flow drag or a fluid flow control valve.

It is also an objective of this disclosure to describe microfluidic devices comprising polymer surfaces with surface structures formed by the methods of this disclosure.

It is yet another objective of this disclosure to describe polymer surfaces comprising hydrophobic surface structurers containing micro features and nano features. Examples of such micro features include but not limited to microgrooves and micro bumps. A non-limiting range for the height microgrooves is 5-10 microns, while non-limiting ranges for the microgroove spacing and width are 10-50 microns, and 5-20 microns respectively. A non-limiting range for the height microbumps is 5-10 microns, while non-limiting ranges for the microgroove spacing and width are 10-50 microns, and 10-50 microns respectively. Other non-limiting examples of nano features include nanoripples and nanobumps. Nanoripples can vary in width between 10 nm and 1 micron, while their height can vary between 10 nm and 1 micron. The width as well as the height of the nanobumps can vary between 100 nm and 1 micron. It should be recognized that polymer surfaces containing surface structures that include the micro and nano features described in this disclosure can be contoured.

While the present disclosure has been described with reference to certain embodiments, it will be apparent to those of ordinary skill in the art that other embodiments and implementations are possible that are within the scope of the present disclosure without departing from the spirit and scope of the present disclosure. Thus, the implementations should not be limited to the particular limitations described. Other implementations may be possible. It is therefore intended that the foregoing detailed description be regarded as illustrative rather than limiting. Thus, this disclosure is limited only by the following claims.

The invention claimed is:

1. A method for creating a polymer surface with surface structures, the method comprising:
    creating a mold;
    forming a metal sheet into the mold;
    creating a surface structure on a surface of the metal sheet by exposing the surface to laser pulses capable of creating laser induced periodic surface structures by varying laser fluence to vary the depths of the laser induced periodic surface structures;
    bringing a curable polymer to be in contact with the surface of the metal sheet containing the surface structure;
    curing the curable polymer;
    separating the cured polymer from the metal sheet, resulting in a polymer surface containing the surface structure;
    wherein the surface structure contains micro features and nano features;
    wherein the micro features are one of microgrooves and microbumps and the nano features are one of nanoripples and nanobumps having width and height in the range of 100 nm to 1 micron; and
    wherein the surface structure achieves water contact angles over 150 degrees and roll off angles less than 5 degrees.

2. The method of claim 1, wherein the surface of the metal is a contoured surface and the polymer surface is a contoured surface.

3. The method of claim 1, wherein the metal is an alloy.

4. The method of claim 2, wherein the metal is copper or aluminum.

5. The method of claim 3, wherein the alloy is one of an alloy of copper, an alloy of aluminum, and steel.

6. The method of claim 1, wherein the polymer is Polydimethylsiloxane (PDMS).

7. The method of claim 1, wherein the surface structure is contained in a microchannel.

8. The method of claim 1, wherein the surface structures are superhydrophobic.

9. The method of claim 7, wherein the surface structure is contained in the microchannel is superhydrophobic. .

* * * * *